(12) United States Patent
Shen et al.

(10) Patent No.: US 10,945,352 B2
(45) Date of Patent: Mar. 9, 2021

(54) COOLING DEVICE AND MANUFACTURING METHOD THEREFOR

(71) Applicant: Dawning Information Industry (Beijing) Co., Ltd, Beijing (CN)

(72) Inventors: Weidong Shen, Beijing (CN); Chen Wang, Beijing (CN); Hongjie Wu, Beijing (CN); Xing Li, Beijing (CN); Jingnan Peng, Beijing (CN); Zhen Sun, Beijing (CN); Xintao Cui, Beijing (CN); Jin Chen, Beijing (CN)

(73) Assignee: Dawning Information Industry (Beijing) Co., Ltd, Beijing (CN)

( * ) Notice: Subject to any disclaimer, the term of this patent is extended or adjusted under 35 U.S.C. 154(b) by 0 days.

(21) Appl. No.: 16/344,521

(22) PCT Filed: Apr. 28, 2017

(86) PCT No.: PCT/CN2017/082333
§ 371 (c)(1),
(2) Date: Apr. 24, 2019

(87) PCT Pub. No.: WO2018/076646
PCT Pub. Date: May 3, 2018

(65) Prior Publication Data
US 2019/0246518 A1  Aug. 8, 2019

(30) Foreign Application Priority Data

Oct. 28, 2016  (CN) .......................... 201610965527.7

(51) Int. Cl.
*H05K 7/20*  (2006.01)
*G06F 1/20*  (2006.01)
*H01L 23/34*  (2006.01)

(52) U.S. Cl.
CPC ........... *H05K 7/20236* (2013.01); *G06F 1/20* (2013.01); *H01L 23/34* (2013.01); *H05K 7/203* (2013.01);
(Continued)

(58) Field of Classification Search
CPC ........... H05K 7/20236; H05K 7/20309; H05K 7/20254; H05K 7/2029; H05K 7/20809;
(Continued)

(56) References Cited

U.S. PATENT DOCUMENTS 6,411,508 B1 * 6/2002 Kang .................. H01L 23/3733
                                                                165/185
7,652,886 B2 * 1/2010 Li ....................... H01L 23/4006
                                                                361/719

(Continued)

FOREIGN PATENT DOCUMENTS

CN          102045985 A          5/2011

OTHER PUBLICATIONS

International Search Report of PCT Patent Application No. PCT/CN2017/082333 dated Aug. 8, 2017.

*Primary Examiner* — Stephen S Sul

(57) ABSTRACT

A cooling device of a heating element for an immersion type liquid cooling server, and a manufacturing method for the cooling device. The cooling device comprises: a metal substrate provided on the heating element and covering same. The metal substrate is adjacent to the surface of the heating element. The surface of the metal substrate distant to the heating element comprises a porous metal covering layer located above the heating element and covering same. The porous metal covering layer is exposed on the surface of the metal substrate remote from the heating element and has a thickness of less than 3 mm. By providing a metal substrate having a porous metal covering layer on the surface of a (Continued)

heating element, vaporization cores are improved, the boiling performance of the heating element is improved, and an efficient heat-dissipating effect on the surface of the heating element is achieved.

18 Claims, 5 Drawing Sheets

(52) U.S. Cl.
CPC ..... H05K 7/20254 (2013.01); H05K 7/20309 (2013.01); H05K 7/20809 (2013.01)

(58) Field of Classification Search
CPC ..... H05K 7/203; H01L 23/34; H01L 21/4871; H01L 23/44; H01L 23/3736; G06F 1/20; G06F 2200/201
USPC .......................................... 361/704, 709, 711
See application file for complete search history.

(56) References Cited

U.S. PATENT DOCUMENTS

| | | | | |
|---|---|---|---|---|
| 7,782,623 | B2* | 8/2010 | Liu | H01L 23/4006 361/719 |
| 7,957,147 | B2* | 6/2011 | Ma | H01L 23/4006 361/709 |
| 9,826,662 | B2* | 11/2017 | Kim | F28F 21/08 |
| 2003/0136550 | A1* | 7/2003 | Tung | F28D 15/0233 165/104.26 |
| 2008/0028787 | A1* | 2/2008 | Mieda | F25B 35/04 62/480 |
| 2008/0186678 | A1* | 8/2008 | North | G06F 1/20 361/700 |
| 2008/0237845 | A1* | 10/2008 | Kim | G06F 1/203 257/715 |
| 2009/0027858 | A1* | 1/2009 | Lai | H01L 23/4093 361/709 |
| 2009/0109626 | A1* | 4/2009 | Sinha | H01L 23/367 361/704 |
| 2009/0165996 | A1* | 7/2009 | Lynch | H01L 23/467 165/80.3 |
| 2010/0290190 | A1* | 11/2010 | Chester | H05K 7/20772 361/701 |
| 2011/0037937 | A1* | 2/2011 | Yang | G02F 1/133385 349/161 |
| 2011/0061848 | A1* | 3/2011 | Chiou | F28F 13/003 165/185 |
| 2011/0315343 | A1* | 12/2011 | Campbell | F28D 15/0233 165/80.3 |
| 2012/0182693 | A1* | 7/2012 | Boday | C09K 5/14 361/713 |
| 2013/0105120 | A1* | 5/2013 | Campbell | H05K 7/203 165/104.21 |
| 2013/0105122 | A1* | 5/2013 | Campbell | H05K 7/203 165/104.26 |
| 2014/0071626 | A1* | 3/2014 | Campbell | B23P 15/26 361/700 |
| 2014/0124174 | A1* | 5/2014 | Campbell | F28F 3/048 165/104.31 |
| 2014/0262192 | A1* | 9/2014 | Boday | H01L 23/3737 165/185 |
| 2015/0109735 | A1* | 4/2015 | Campbell | H05K 7/20318 361/700 |
| 2015/0262907 | A1* | 9/2015 | Degner | H05K 1/181 361/679.47 |
| 2015/0359143 | A1* | 12/2015 | Silvennoinen | H05K 7/20509 165/185 |
| 2016/0044824 | A1* | 2/2016 | North | G06F 1/20 361/679.47 |
| 2017/0186667 | A1* | 6/2017 | Choudhury | H01L 24/32 |

* cited by examiner

COOLING DEVICE AND MANUFACTURING METHOD THEREFOR

TECHNICAL FIELD

The present application relates to the field of computer technology, in particular to a cooling device for heating element of immersed type liquid cooling server and a method of manufacturing the same.

BACKGROUND

In addition to the common air cooling method that relies on cold air to dissipate heat from the computer, there is also a liquid cooling method. The method directs the coolant directly to the heat source, and the air cooling method is for indirect refrigeration. The heat transfer per unit volume for the liquid cooling method can achieve a heat dissipation efficiency of 3500 times that of the air cooling method. Liquid-cooled heat sinks appeared on the market around 2008. Server vendors such as Hewlett-Packard and IBM and other companies focused on data center technology have introduced liquid cooling products.

Evaporative cooling is a cooling method that utilizes the latent heat of vaporization when the fluid boils to remove heat. Since the latent heat of vaporization of the fluid is much larger than the specific heat of the fluid, the cooling effect of evaporative cooling is more significant. In the immersed type liquid cooling server, when the immersion cooling is performed using the refrigerant, the heat sinks such as fins and fans required for the air cooling method are eliminated, and only the phase change of the refrigerant is used for heat exchange to cool the CPU. The processing method, surface roughness, material properties and the degree of aging for heat transfer surfaces can affect the strength of boiling heat transfer.

At present, the surface of the existing CPU cover on the market is smooth, and it is not easy to generate bubbles, and the boiling performance is not good enough. The CPU cover is made of copper and is coated with a layer of nickel on the surface. The surface of the copper-plated nickel material is a smooth surface, which is not conducive to vaporization. The same liquid has a lower heat transfer coefficient when performing boiling heat transfer on a smooth surface than when performing boiling heat transfer on a rough surface, mainly due to less vaporized cores on the smooth surface. Therefore, after the power is turned on, the temperature of the CPU rises rapidly, the steady-state temperature is high, and it is easy to reach the limit temperature of the CPU, which makes most server manufacturers deterred from the immersed type liquid cooling technology.

In view of the problems in the related art that the surface of the heating element such as the CPU has few vaporization cores and the boiling performance is not good, no effective solution has yet been proposed.

SUMMARY

In view of the problems in the related art that the surface of the heating element such as the CPU has few vaporization cores and the boiling performance is not good, the present application provides a cooling device and a manufacturing method thereof, which may increase the vaporization cores on the surface of the heating element, strengthen the boiling performance of the heating element, and reduce the core temperature of the heating element.

In order to achieve the object of the present application, the technical solution adopted by the present application is: providing a cooling device for heating elements of immersed type liquid cooling server, comprising a metal substrate disposed above the heating element and covering the heating element; the metal substrate is adjacent to a surface of the heating element; and a surface of the metal substrate remote from the heating element includes a porous metal covering layer located above the heating element and covering the heating element. The porous metal covering layer is exposed on the surface of the metal substrate remote from the heating element.

Preferably, the porous metal covering layer is formed by powder sintering a corresponding region of the surface of the metal substrate remote from the heating element.

Preferably, the metal substrate further includes a downwardly projecting portion covering the surface of the heating element, and the metal substrate is adjacent to the surface of the heating element by the downwardly projecting portion.

Preferably, further comprising: a layer of flexible high thermal conductive material disposed between the surface of the heating element and the metal substrate and covering the surface of the heating element.

Preferably, the metal substrate further includes a mounting structure for fixing the metal substrate.

Preferably, the material of the metal substrate is copper, titanium or stainless steel; the material of the metal powder used for the powder sintering is copper, copper-plated silver, iron or iron alloy powder.

Preferably, the layer of flexible high thermal conductivity material is an indium metal sheet.

Preferably, the thickness of the porous metal covering layer is less than 3 mm; and the porosity of the porous metal covering layer is between 40% and 95%.

Preferably, the heating element includes a CPU or a GPU.

Moreover, the present application further provide a method for manufacturing cooling device for a heating element of immersed type liquid cooling server, comprising: providing a metal substrate; increasing surface roughness, vaporization cores, bubble generation points, and boiling performance of the heating element by forming a porous metal covering layer on a region of the metal substrate corresponding to the heating element; and providing the metal substrate above the heating element and covering the heating element, wherein the porous metal covering layer is located above the heating element and covers the heating element, and the porous metal covering layer is exposed on the surface of the metal substrate remote from the heating element and has a thickness of less than 3 mm; wherein the step of forming a porous metal covering layer on a region of the metal substrate corresponding to the heating element includes forming the porous metal covering layer by powder sintering a corresponding region of the surface of the metal substrate remote from the heating element.

In the present application, by providing a metal substrate having a porous metal covering layer on the surface of the heating element, the vaporization cores are increased, the boiling performance of the heating element is improved, and an efficient heat dissipation effect on the surface of the heating element is achieved.

Figure 1A:
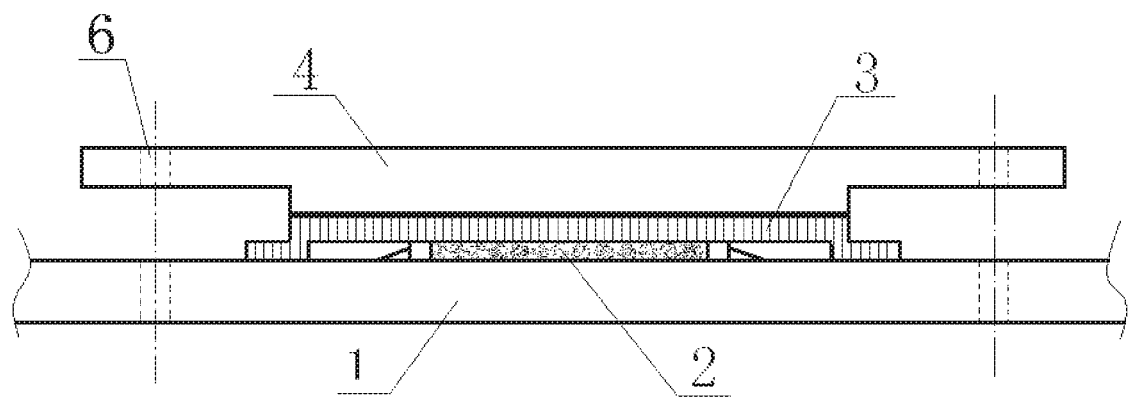
FIG. 1A is a cross-sectional view showing a mounting structure of a CPU in accordance with an embodiment of the present application.
Figure 1B:
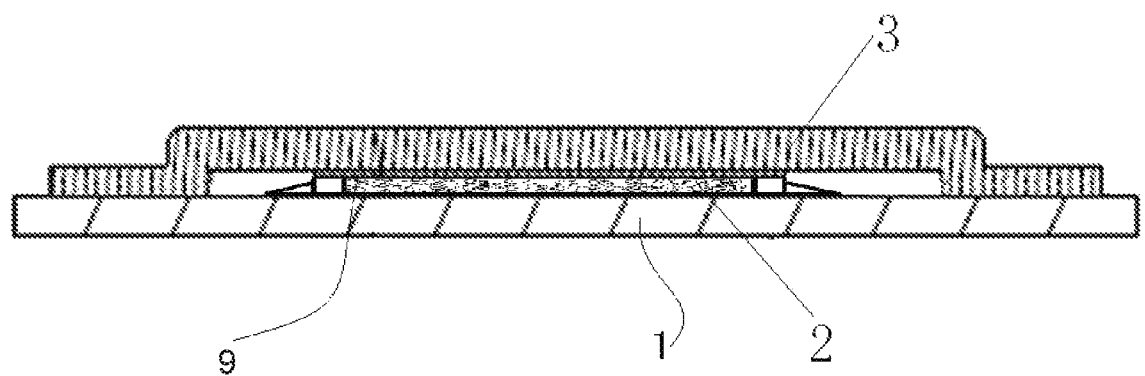
FIG. 1B is an enlarged cross-sectional view showing a layer of flexible high thermal conductive material of the mounting structure of a CPU in FIG. 1A in accordance with an embodiment of the present application.

Reference numerals: 1—motherboard, 2—CPU, 3—CPU cover, 4—metal substrate, 5—downwardly projecting portion, 6—mounting hole, 7—first surface, 71—porous metal covering layer, 8—second surface.

DETAILED DESCRIPTION OF THE EMBODIMENTS

To make the purpose, technical solutions and advantages of the present application clearer, the specific embodiment of the present application will be described below in detail in combination with the drawings. It should be noted that, in the case of no conflicts, the embodiments of the present application and features in the embodiments can be combined arbitrarily and mutually.

According to an embodiment of the present application, a cooling device for heating elements of immersed type liquid cooling server is provided.

The heating element may also include other members that are prone to heat, such as a memory, a CPU, or a GPU chip, depending on the actual situation of the server type, etc., and the present application does not specifically limit the heating element. A motherboard 1 of the liquid cooling server is usually mounted with a CPU 2, and the CPU 2 is covered with a CPU cover 3, and the following description will be made by taking a heating element as a CPU.

The cooling device according to an embodiment of the invention comprises a metal substrate 4 disposed above the heating element and covering the heating element (not shown); the metal substrate 4 is adjacent to a surface of the heating element; and a first surface 7 of the metal substrate 4 remote from the heating element includes a porous metal covering layer 71, the porous metal covering layer 71 being located above the heating element and covering the heating element. The porous metal covering layer 71 is exposed on the first surface 7 of the metal substrate 4 remote from the heating element.

Among them, in an embodiment, the porous metal covering layer 71 is formed by powder sintering a corresponding region of the first surface 7 of the metal substrate 4 remote from the heating element. The material of the metal substrate 4 is copper, and other metal or alloy metal having good thermal conductivity such as copper, copper silver plating, titanium or stainless steel may be used.

Specifically, the powder sintering includes the following steps: first, removing rust and grease from the surface 7 of the metal substrate 4 remote from the heating element, then applying a layer of binder solution including olypropylene, polyethylene, polystyrene, polyethylene terephthalate, polymethacrylic acid, acetone or xylene, etc., applying the sintered metal powder uniformly on the first surface 7 of the metal substrate 4 remote from the heating element (the metal powder includes copper powder, iron powder or iron alloy powder, etc., and the weight ratio of the metal powder to the binder is 10:(2 to 5)), placing the metal substrate 4 in the sintering furnace when the binder solution is air dried for heating under hydrogen protection until the surface of the sintered metal powder has a tendency to melt, dispersing and evaporating the binder after about 20 minutes of constant temperature before the metal powder is sintered and integrated on the first surface 7 of the metal substrate 4 remote from the heating element, so that a porous metal covering layer 71 is formed on the first surface 7 of the metal substrate 4 remote from the heating element. The thickness of the porous metal covering layer 71 is generally less than 3 mm, and the porosity of the porous metal covering layer 71 is between 40% and 95%.

Figure 2:
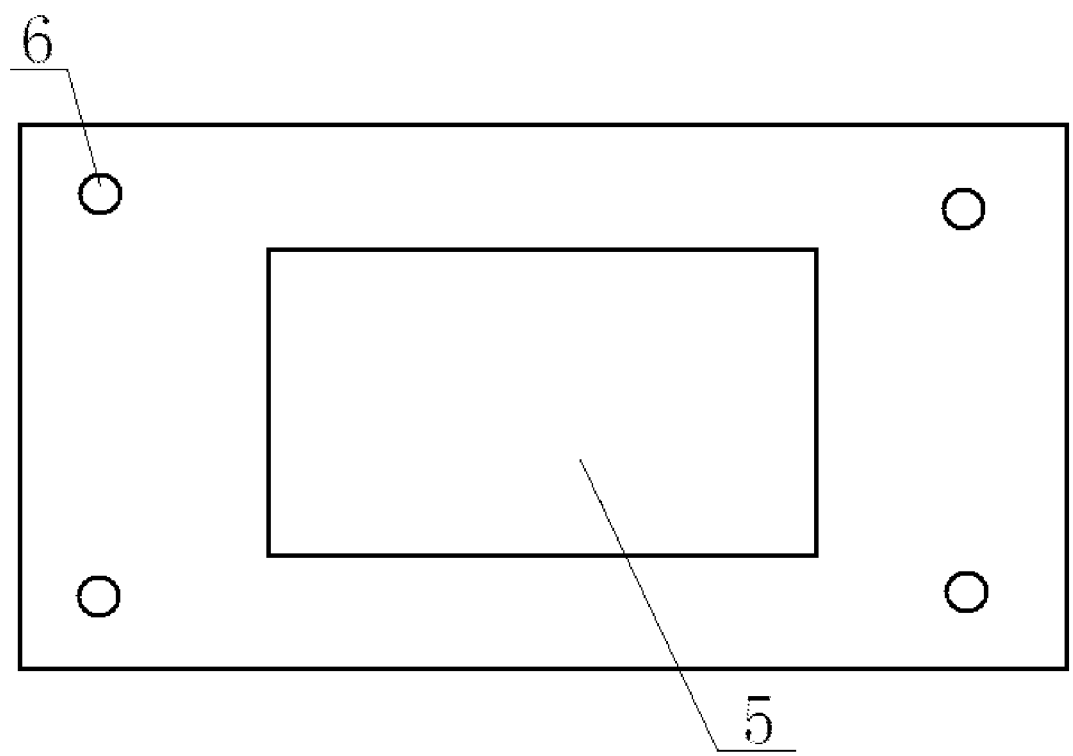
FIG. 2 shows a bottom view of a metal substrate in accordance with an embodiment of the present application.

As shown in FIG. 2, by forming the porous metal covering layer 71 through powder sintering a corresponding region of the first surface 7 of the metal substrate 4 remote from the heating element, the surface roughness, a micro-gap and bubble generation points are increased, which may effectively enhance boiling performance.

In an embodiment, since the CPU cover 3 is not easily removed, and the CPU chip 2 is not resistant to high temperatures, treatment may not be directly performed on the surface. Therefore, a surface of a thin copper sheet having the same shape and size as that of the CPU 2 may be subjected to powder sintering treatment to form the cooling device of the present application, and then the cooling device is welded to the CPU cover 3 by a low-temperature welding method, to achieve an effect of enhancing boiling heat exchange.

In an embodiment, since the weldment is difficult to remove, the subsequent warranty of the CPU 2 may be affected. Thus, preferably, the metal substrate 4 further includes a mounting structure for fixing the metal substrate 4. The mounting structure may be other structures for fixing the metal substrate 4 depending on actual needs of the heating element or the like. Specifically, with reference to FIGS. 2 and 3, a position of the first surface 7 of the metal substrate 4 remote from the heating element corresponding to the CPU 2 is subjected to powder sintering treatment to enhance boiling performance; then, mounting holes 6 are left at the four corners of the metal substrate 4 (i.e., the mounting structure is the mounting hole 6) for fastening the metal substrate 4 through the mounting hole 6 with a fastening screw to a corresponding threaded hole on the motherboard 1, so that the metal substrate 4 is pressed directly above the CPU 2. Among them, when the CPU or GPU is shipped from the factory, there is a maximum pressure that the chip may withstand. So the fastening force of the fastening screw should be calculated according to the weight of the metal substrate 4 itself to ensure that the chip may not be damaged due to the pressure. Since the fan and the fin are mounted above the CPU 2 when the air cooling method is used and the motherboard has a threaded hole for fixing the fan and the fin, for easy mounting, the position for the mounting hole 6 of the metal substrate 4 may be corresponding to the position for the threaded holes of the original fixed fan and the fin without modification or structural deformation of the motherboard 1, so that the applicability of the cooling device is improved.

Figure 3:
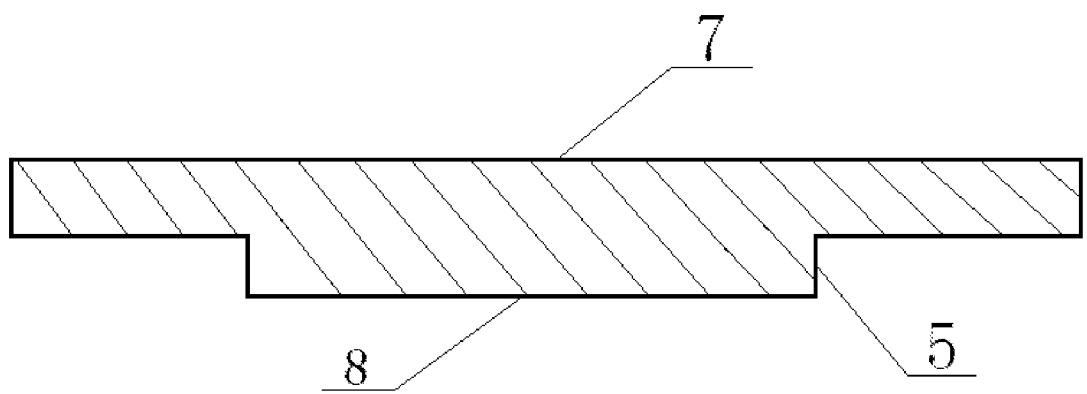
FIG. 3 shows a cross-sectional view of a metal substrate in accordance with an embodiment of the present application.
Figure 4:
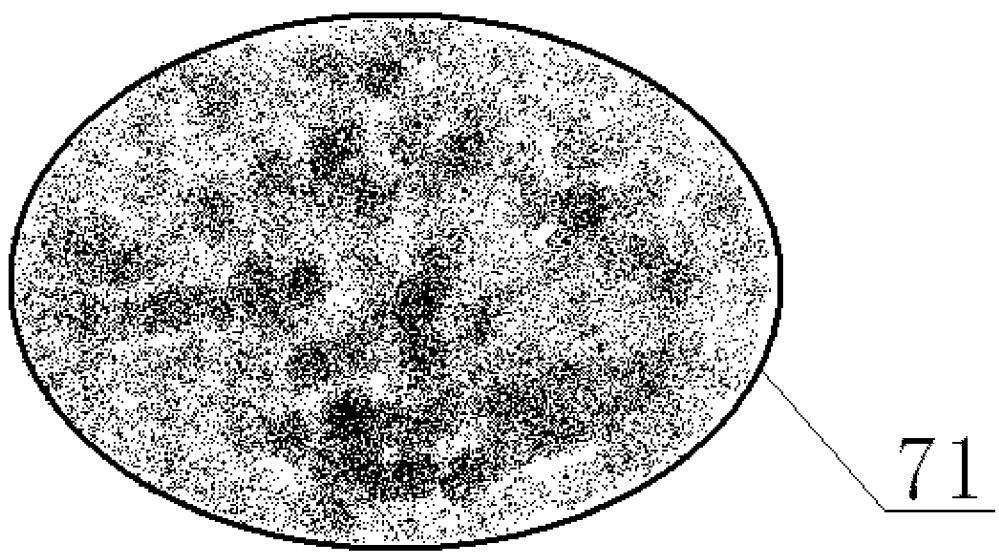
FIG. 4 is a view showing the structure of a porous metal covering layer in accordance with an embodiment of the present application.
Figure 5:
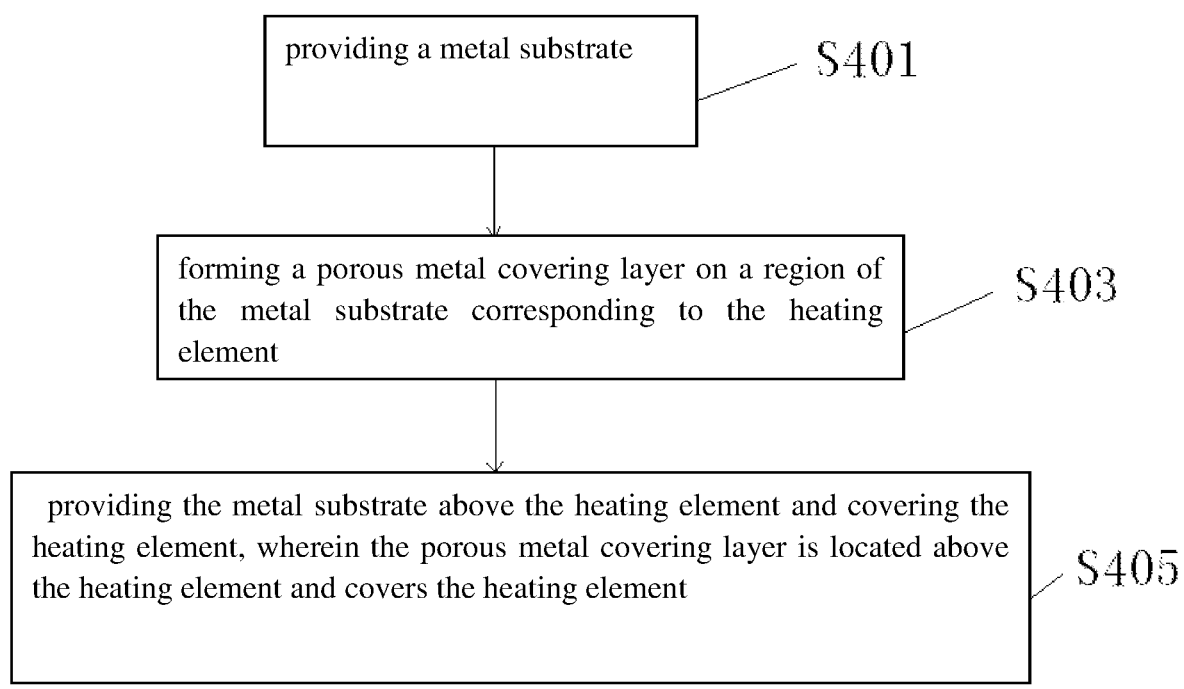
FIG. 5 is a flow chart showing a method of manufacturing cooling device in accordance with an embodiment of the present application.

With similar reference to FIGS. 2 and 3, the metal substrate 4 further includes a downwardly projecting portion 5 covering the surface of the heating element, and the downwardly projecting portion 5 is located on the side of the metal substrate 4 adjacent to the heating element, the metal substrate 4 being in contact with the surface of the heating element through the downwardly projecting portion 5. By providing the downwardly projecting portion 5, heat conduction and contact between the metal substrate 4 and the CPU 2 may be enhanced.

In an embodiment, the cooling device of the heating element of the present application further comprises a layer of flexible high thermal conductive material 9 disposed between the metal substrate 4 and the CPU 2 for reducing the contact thermal resistance therebetween. The layer of flexible high thermal conductive material 9 is a metal layer, a special rubber, a special plastic or graphene, and is disposed between the surface of the heating element and the metal substrate 4 and covers the surface of the heating element. Due to the inability to use thermal grease in immersed type liquid cooling system, the metal layer is a soft metal thin metal sheet to avoid hard contact between the metal substrate 4 and the CPU 2 when a metal layer is used as the layer of flexible high thermal conductive material, thereby filling the gap therebetween and reducing contact thermal resistance. The material of the metal layer may be indium metal or the like.

In above technical solution, for the present application, by providing a metal substrate 4 having a porous metal covering layer 71 on the surface of the heating element, the vaporization cores are increased, the boiling performance of the heating element is improved, and an efficient heat dissipation effect on the surface of the heating element is achieved.

According to an embodiment of the present application, a method for manufacturing a cooling device for a heating element of immersed type liquid cooling server is further provided, comprises steps of:

step S401, providing a metal substrate 4;

step S403, increasing surface roughness, vaporization cores, bubble generation points, and boiling performance of the heating element by forming a porous metal covering layer 71 on a region of the metal substrate 4 corresponding to the heating element; and step S405, providing the metal substrate 4 above the heating element and covering the heating element, wherein the porous metal covering layer 71 is located above the heating element and covers the heating element, and the porous metal covering layer 71 is exposed on the first surface 7 of the metal substrate 4 remote from the heating element and has a thickness of less than 3 mm.

Further, step S403 includes forming the porous metal covering layer 71 by powder sintering a corresponding region of the surface of the metal substrate 4 remote from the heating element.

In summary, with the above technical solution of the present application, by providing a metal substrate having a porous metal covering layer on the surface of the heating element, the vaporization cores are added, the boiling performance of the heating element is improved, and the heat dissipation effect on the surface of the heating element is realized efficiently. Moreover, by forming the porous metal covering layer through powder sintering a region of the metal substrate corresponding to the heating element, the surface roughness, a micro-gap and bubble generation points are increased, which may effectively enhance boiling performance. Furthermore, by providing the convex portion, heat conduction and contact between the metal substrate and the heating element are enhanced, and a softer metal layer is disposed between the metal substrate and the heating element to reduce the contact thermal resistance therebetween.

While the embodiments of the present application have been described above, the described embodiments are merely illustrative of the embodiments of the present application, and are not intended to limit the present application. Any modifications and changes in form and detail may be made by those skilled in the art to which the present application pertains without departing from the spirit and scope of the present application, but all fall within the scope of the present application.

What is claimed is:

1. A cooling device for a heating element of immersed type liquid cooling server, comprising a metal substrate disposed above the heating element and covering the heating element;

the metal substrate is adjacent to a surface of the heating element;

a surface of the metal substrate remote from the heating element includes a porous metal covering layer located above the heating element and covering the heating element, and the porous metal covering layer is exposed on the surface of the metal substrate remote from the heating element;

wherein the metal substrate further comprises a downwardly projecting portion covering the surface of the heating element, and the metal substrate is in thermal contact with the surface of the heating element through the downwardly projecting portion, and the thickness of the porous metal covering layer is less than 3 mm; and mounting holes are left at four corners of the metal substrate for fastening the metal substrate through the mounting holes with fastening screws to corresponding threaded holes on a substrate of the heating element.

2. The cooling device for the heating element of immersed type liquid cooling server according to claim 1, wherein the porous metal covering layer is formed by powder sintering a corresponding region of the surface of the metal substrate remote from the heating element.

3. The cooling device for the heating element of immersed type liquid cooling server according to claim 2, wherein a material of the metal substrate is copper, titanium or stainless steel;

a material of a metal powder used for the powder sintering is copper, copper-plated silver, iron or iron alloy powder.

4. The cooling device for the heating element of immersed type liquid cooling server according to claim 2, further comprising:

a layer of flexible high thermal conductive material disposed between the surface of the heating element and the metal substrate and covering the surface of the heating element.

5. The cooling device for the heating element of immersed type liquid cooling server according to claim 4, wherein the layer of flexible high thermal conductive material is an indium metal sheet.

6. The cooling device for the heating element of immersed type liquid cooling server according to claim 2, wherein the metal substrate further includes a mounting structure for fixing the metal substrate.

7. The cooling device for the heating element of immersed type liquid cooling server according to claim 1, further comprising:

a layer of flexible high thermal conductive material disposed between the surface of the heating element and the metal substrate and covering the surface of the heating element.

8. The cooling device for the heating element of immersed type liquid cooling server according to claim 7, wherein the layer of flexible high thermal conductive material is an indium metal sheet.

9. The cooling device for the heating element of immersed type liquid cooling server according to claim 7, wherein
the metal substrate further includes a mounting structure for fixing the metal substrate.

10. The cooling device for the heating element of immersed type liquid cooling server according to claim 7, wherein
a material of the metal substrate is copper, titanium or stainless steel;
a material of a metal powder used for powder sintering to form the porous metal covering layer is copper, copper-plated silver, iron or iron alloy powder.

11. The cooling device for the heating element of immersed type liquid cooling server according to claim 1, wherein
the metal substrate further includes a mounting structure for fixing the metal substrate.

12. The cooling device for the heating element of immersed type liquid cooling server according to claim 11, wherein
a material of the metal substrate is copper, titanium or stainless steel;
a material of a metal powder used for powder sintering to form the porous metal covering layer is copper, copper-plated silver, iron or iron alloy powder.

13. The cooling device for the heating element of immersed type liquid cooling server according to claim 1, wherein
the porosity of the porous metal covering layer is between 40% and 95%.

14. The cooling device for the heating element of immersed type liquid cooling server according to claim 1, wherein
the heating element includes a CPU or a GPU.

15. The cooling device for the heating element of immersed type liquid cooling server according to claim 1, further comprising:
a layer of flexible high thermal conductive material disposed between the surface of the heating element and the metal substrate and covering the surface of the heating element.

16. The cooling device for the heating element of immersed type liquid cooling server according to claim 1, wherein
the metal substrate further includes a mounting structure for fixing the metal substrate.

17. The cooling device for the heating element of immersed type liquid cooling server according to claim 1, wherein
a material of the metal substrate is copper, titanium or stainless steel;
a material of a metal powder used for powder sintering to form the porous metal covering layer is copper, copper-plated silver, iron or iron alloy powder.

18. A method for manufacturing a cooling device for a heating element of immersed type liquid cooling server, comprising:
providing a metal substrate, mounting holes being left at four corners of the metal substrate for fastening the metal substrate through the mounting holes with fastening screws to corresponding threaded holes on a substrate of the heating element;
increasing surface roughness, vaporization cores, bubble generation points, and boiling performance of the heating element by forming a porous metal covering layer on a region of the metal substrate corresponding to the heating element; and
providing the metal substrate above the heating element and covering the heating element, wherein the porous metal covering layer is located above the heating element and covers the heating element, and the porous metal covering layer is exposed on a surface of the metal substrate remote from the heating element and has a thickness of less than 3 mm;
wherein the step of forming the porous metal covering layer on the region of the metal substrate corresponding to the heating element includes forming the porous metal covering layer by powder sintering the region of the metal substrate corresponding to the heating element.

* * * * *